US006970357B2

(12) United States Patent
Hsieh

(10) Patent No.: US 6,970,357 B2
(45) Date of Patent: Nov. 29, 2005

(54) RECTIFIER BRIDGE ASSEMBLY

(76) Inventor: Joe C. Y. Hsieh, 87 E. Gainsborough Rd., Thousand Oaks, CA (US) 91360-3553

( * ) Notice: Subject to any disclaimer, the term of this patent is extended or adjusted under 35 U.S.C. 154(b) by 0 days.

(21) Appl. No.: 10/632,050

(22) Filed: Jul. 30, 2003

(65) Prior Publication Data

US 2005/0024833 A1 Feb. 3, 2005

(51) Int. Cl.$^7$ .......................... H05K 7/20; H02K 11/00
(52) U.S. Cl. ...................... 361/704; 361/719; 363/145; 310/68 D
(58) Field of Search ................... 361/702–705, 361/708–710, 141, 145; 257/720, 722; 174/16.3, 174/252; 165/80.3, 185; 310/68 D, 64, 68 R

(56) References Cited

U.S. PATENT DOCUMENTS

| 3,697,814 A | 10/1972 | Christman et al. |
| 4,493,018 A | 1/1985 | Hopmayer et al. |
| 4,809,057 A * | 2/1989 | Ocken ........................ 257/687 |
| 5,424,594 A * | 6/1995 | Saito et al. ................ 310/68 D |
| 5,473,208 A | 12/1995 | Stihi |
| 5,838,544 A * | 11/1998 | Wei ............................. 361/704 |
| 6,528,911 B1 * | 3/2003 | De Petris ..................... 310/64 |
| 6,577,032 B2 * | 6/2003 | Irie ......................... 310/68 D |
| 6,731,030 B2 * | 5/2004 | Keidar et al. ............. 310/68 D |

FOREIGN PATENT DOCUMENTS

EP 1087439 A2 * 3/2001 ........... H01L 23/31

* cited by examiner

Primary Examiner—Boris Chervinsky
(74) Attorney, Agent, or Firm—Law Offices of Kamran Fattahi

(57) ABSTRACT

A rectifier bridge assembly includes a rectifier bridge circuit adapted to connect to at least one alternating current source with at least two diode compartments operatively connected to the rectifier bridge circuit and a direct current output to convert alternating current into direct current. A heat sink is formed with at least two apertures for receiving the at least two diode compartments in spaced apart relation and in substantial contact with the heat sink, wherein heat from the diode compartments is evenly dispersed to the heat sink.

21 Claims, 12 Drawing Sheets

RECTIFIER BRIDGE ASSEMBLY

BACKGROUND OF THE INVENTION

1. Field of the Invention

This invention relates generally to a rectifier bridge assembly such as for use in automotive alternators, and, more particularly, to an improved rectifier bridge assembly for dissipating heat.

2. Description of the Related Art

A rectifier bridge assembly, commonly called a rectifier, is one of the components parts of an alternator assembly forming a portion of the electrical charging system in an automobile. The basic role of the charging system is to replenish the charge of a battery with electricity generated by the alternator. The electrical current generated by the alternator is an alternating current (AC), while the electrical current preserved in the battery is a direct current (DC). The alternating current must be converted to a direct current so that the battery can be charged. This conversion is called rectification, and is the specific function of a rectifier bridge assembly.

The alternator used in a typical automobile is a three-phase type of alternating current (AC) electrical generator. The electricity generated by each phase must be rectified by one rectifier bridge. Each rectifier bridge consists of two diodes and, thus, three rectifier bridges are required for one alternator. Therefore, a typical rectifier bridge assembly consists of three rectifier bridges with six diodes. Three of the six diodes are connected to a ground, and the other three diodes are connected for DC output charging to the battery.

During the rectification process, tremendous amounts of heat are generated by converting the alternating current (AC) to direct current (DC). The heat must be dissipated as quickly and efficiently as possible, or the diodes may be ruined within a relatively short period of time. Therefore, the rectifier bridges are normally soldered onto heat sinks of good heat-conductive materials. Usually a portion of the ground provides a negative heat sink, and some structure associated with the DC output charging to battery provides a positive heat sink that is conductively and terminally isolated from the ground.

Rectifier bridges assemblies are normally assembled as an integrated part of an alternator assembly. The electrical current output of the alternator to the battery greatly depends on the capacity of the rectifier bridge assembly to rectify the alternating current to a direct current. However, the performance of the rectifier bridge assembly with the diodes at a set power level depends heavily on the heat disbursing ability of the heat sinks utilized. The faster heat can be disbursed from the rectifier bridge assembly, the cooler the rectifier can operate. The rectifier also has a longer life and a greater performance. Hence, the capability of the heat sink(s) should be a major concern in the design of a rectifier bridge assembly.

Traditionally rectifier bridges assemblies used in automobiles had two heat sinks, one for the negative side and the other for the positive side. This traditional heat sink design, however, was replaced by the demand to conserve space in an otherwise over-crowded engine compartment. For example, in the rectifier bridge assembly used on Ford Motor Company's 2G alternators, all six diodes are soldered in manner that disperses heat through only one heat sink within an area not greater than 3.6 square inches. This particular design, which is now common in the industry, tends to have a very poor heat dispersing capacity. The poor heat dispersing capacity of such rectifiers makes them fail more easily and prematurely.

One solution for improving the heat dissipating properties in a rectifier bridge assembly of the type such as found in the Ford 2G alternator is disclosed in U.S. Pat. No. 5,892,676 to Hsieh and which is incorporated herein by reference.

In light of the demand to decrease part size in the engine compartment, other attempts to limit the size of the rectifier bridge assembly have been attempted. One such solution has been attempted alternators found in vehicles manufactured by General Motors Company under the series designation "CS" which stands for Charging System manufactured by Delco Remy America, Anderson, Ind. and the series designation "AD" which stands for Air-cooled design with Dual internal fans manufactured by Delphi Corp., Troy, Mich. These designs like the Ford 2G alternator type use a single heat sink to disperse the heat; however, the positive and negative rectifier diodes are not arranged in series as with the Ford 2G type designs, but are arranged in parallel and separated in spaced apart relation throughout wells in the heat sink to reduce the overall thickness of the rectifier bridge assembly and to provide improved heat distribution throughout the heat sink. While fit for its intended purpose, the CS and AD series of alternators suffers from high heat due to the reduced effectiveness of the smaller heat sink. This among other issues has increased the failure rate of the rectifier bridge assembly in the CS and AD series of alternators and causes decreased performance as well. With reference to FIG. 1, Press-fit Diode, a diode assembly 20 for a CS type rectifier bridge assembly is shown in which the diode is formed from a semiconductor material called rectifier die 22 soldered between two copper tabs 24 and 26 and then embedded in epoxy 28 for insertion in one of the holes of the heat sink 29. A lead 30 extends out of the epoxy 28 from the upper copper tab 26 for connecting with the rectifier bridge circuit (not shown) and the opposite side, copper tab 24 is soldered to a metal cap 32, which is pressed fit for connecting in circuit to a positive or negative heat sink as appropriate. There are two drawbacks from this configuration, the first, the air gaps exist between the diode assembly and the heat sink created by the knurl on metal cap, and the second, only limited heat is dispersed through the narrow knurl ring on the metal cap to heat sink; this causes the effectiveness of the heat sink to be greatly reduced.

Accordingly, there has been a need for a novel rectifier bridge assembly that overcomes the above-noted problems in prior art designs. Such a novel rectifier bridge assembly must be adapted for use with standard alternator assemblies and have a design that may be manufactured cost effectively. The present invention fulfills these needs and provides other related advantages.

SUMMARY OF THE INVENTION

A rectifier bridge assembly includes a rectifier bridge circuit adapted to connect to at least one alternating current source with at least two diode compartments operatively connected to the rectifier bridge circuit and a direct current output to convert alternating current into direct current. A heat sink is formed with at least two apertures for receiving the at least two diode compartments in spaced apart relation and in substantial contact with the heat sink, wherein heat from the diode compartments is evenly dispersed to the heat sink.

In one embodiment, each of the diode compartments includes a diode surrounded by heat conductive, electrically non-conductive epoxy contacting substantially all surfaces of the heat sink within the apertures.

In another embodiment, each of the diode compartments includes a diode formed from a rectifier die electrically connected to first and second copper tabs wherein the first copper tab is directly electrically connected to a contact surface in the aperture and the second copper tab is electrically connected to the rectifier bridge circuit.

BRIEF DESCRIPTION OF THE DRAWINGS

Other aspects, advantages and novel features of the invention will become more apparent from the following detailed description of the invention when considered in conjunction with the accompanying drawings wherein.

DETAILED DESCRIPTION

Figure 1:
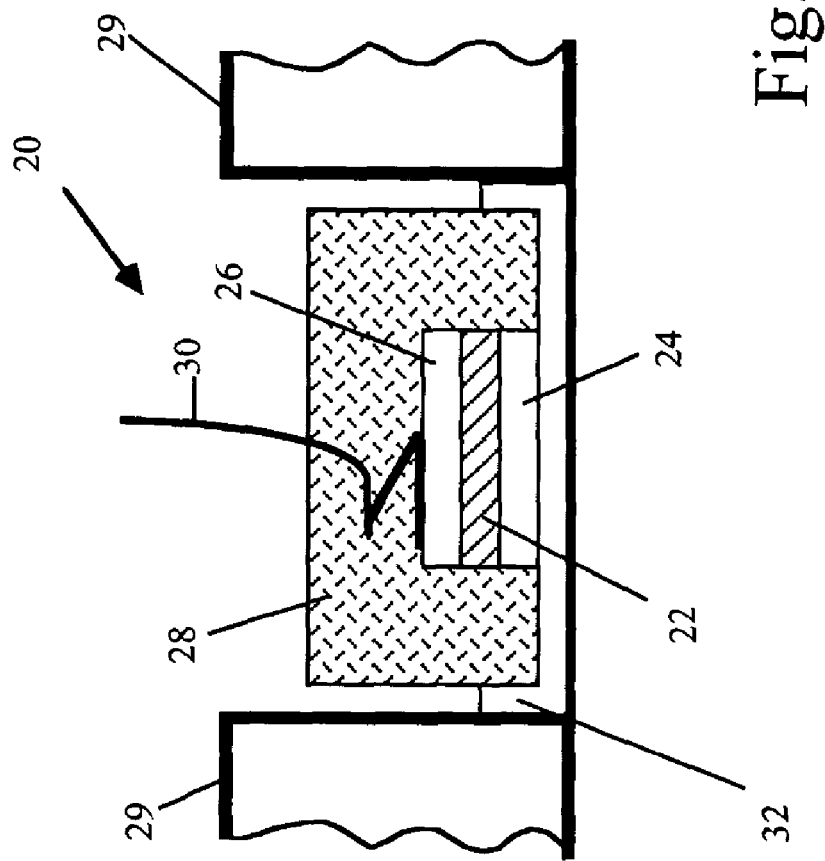
FIG. 1 is a diode assembly using a press fit diode according to the prior art.
Figures 2A, 2B:
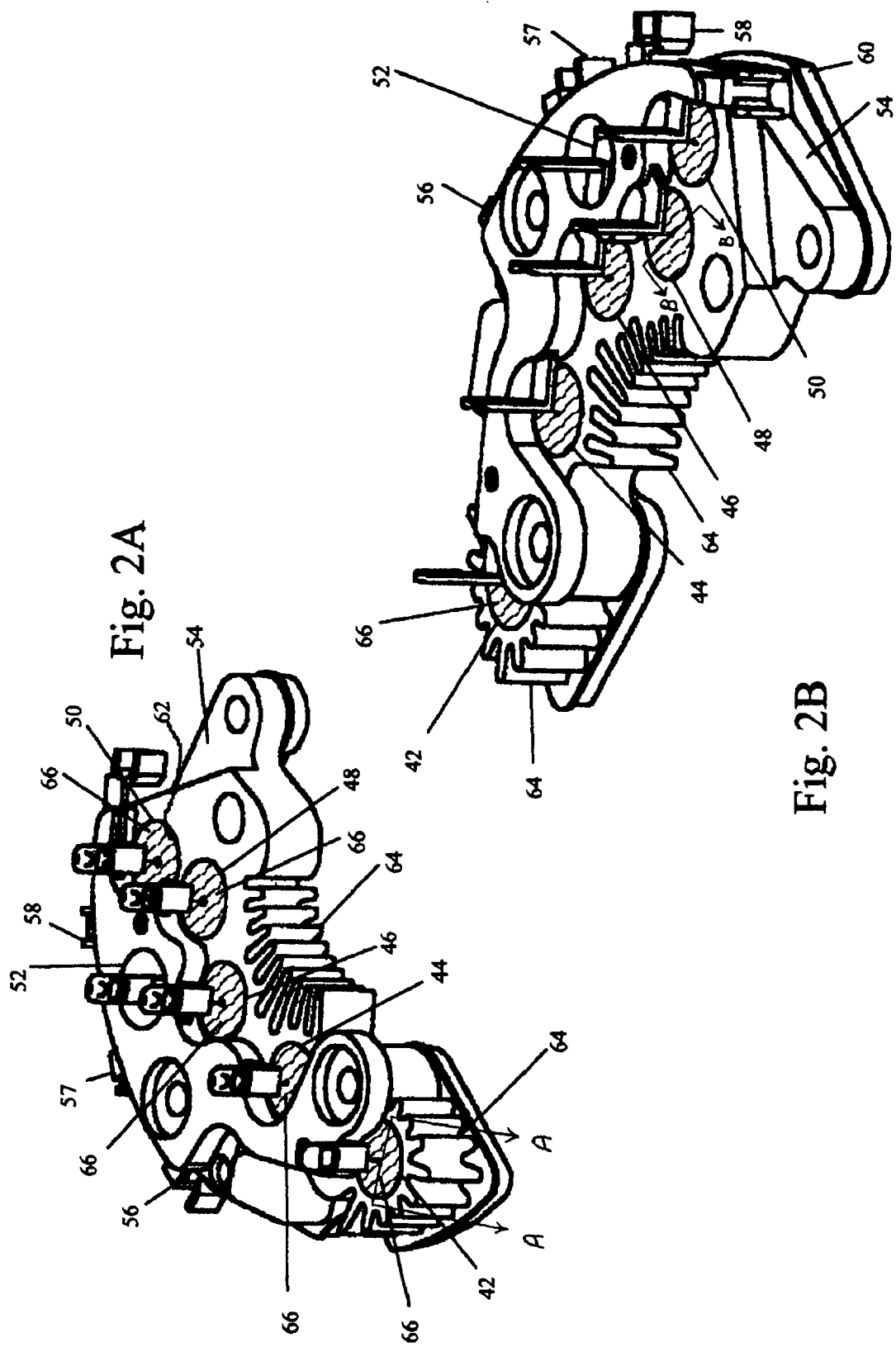
FIGS. 2A and B are perspective views of a rectifier bridge assembly according to the present invention.
Figure 3:
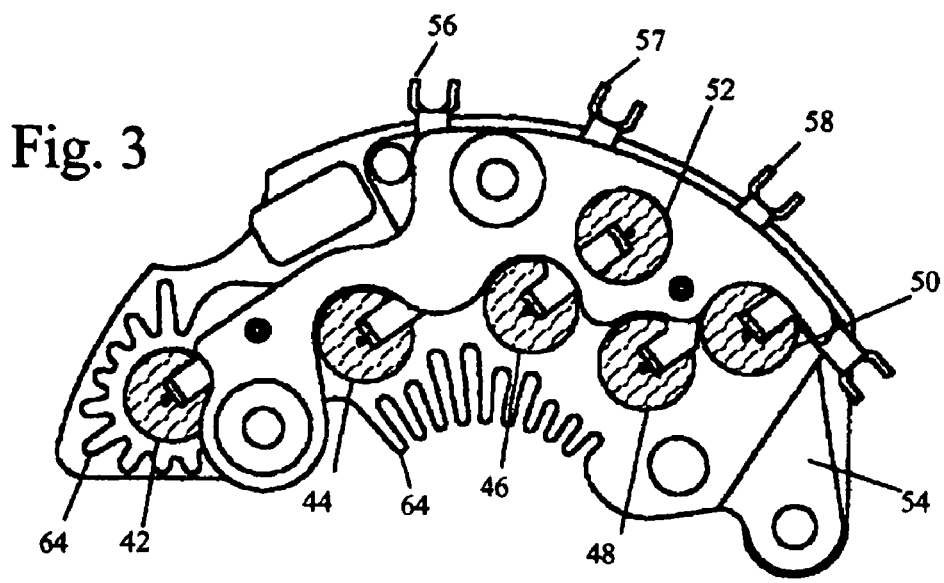
FIG. 3 is a top plan view of the rectifier bridge assembly of FIG. 2.
Figure 4:
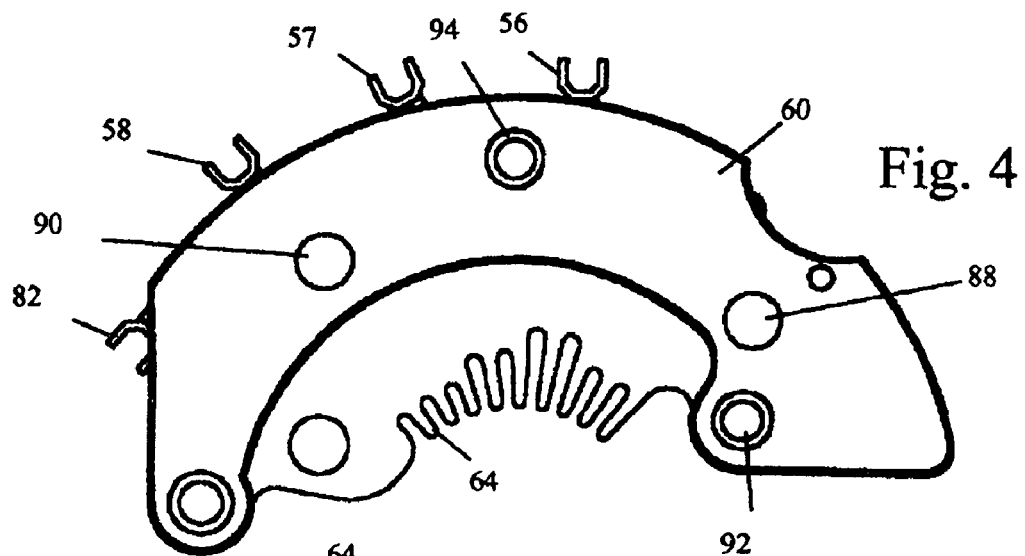
FIG. 4 is a bottom plan view of the rectifier bridge assembly of FIG. 2.
Figure 5:
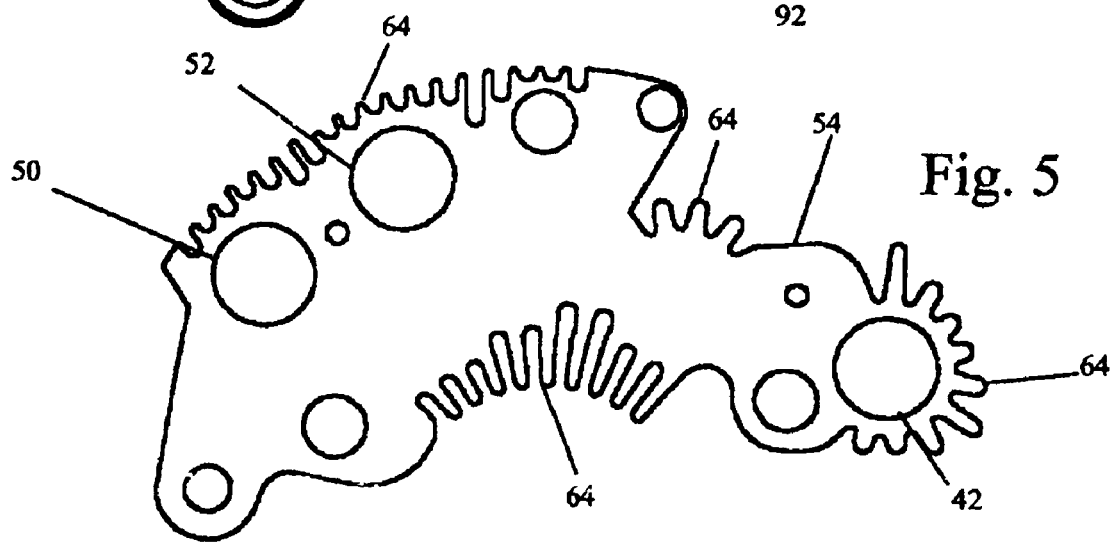
FIG. 5 is a bottom plan view of a positive heat sink.
Figure 6:
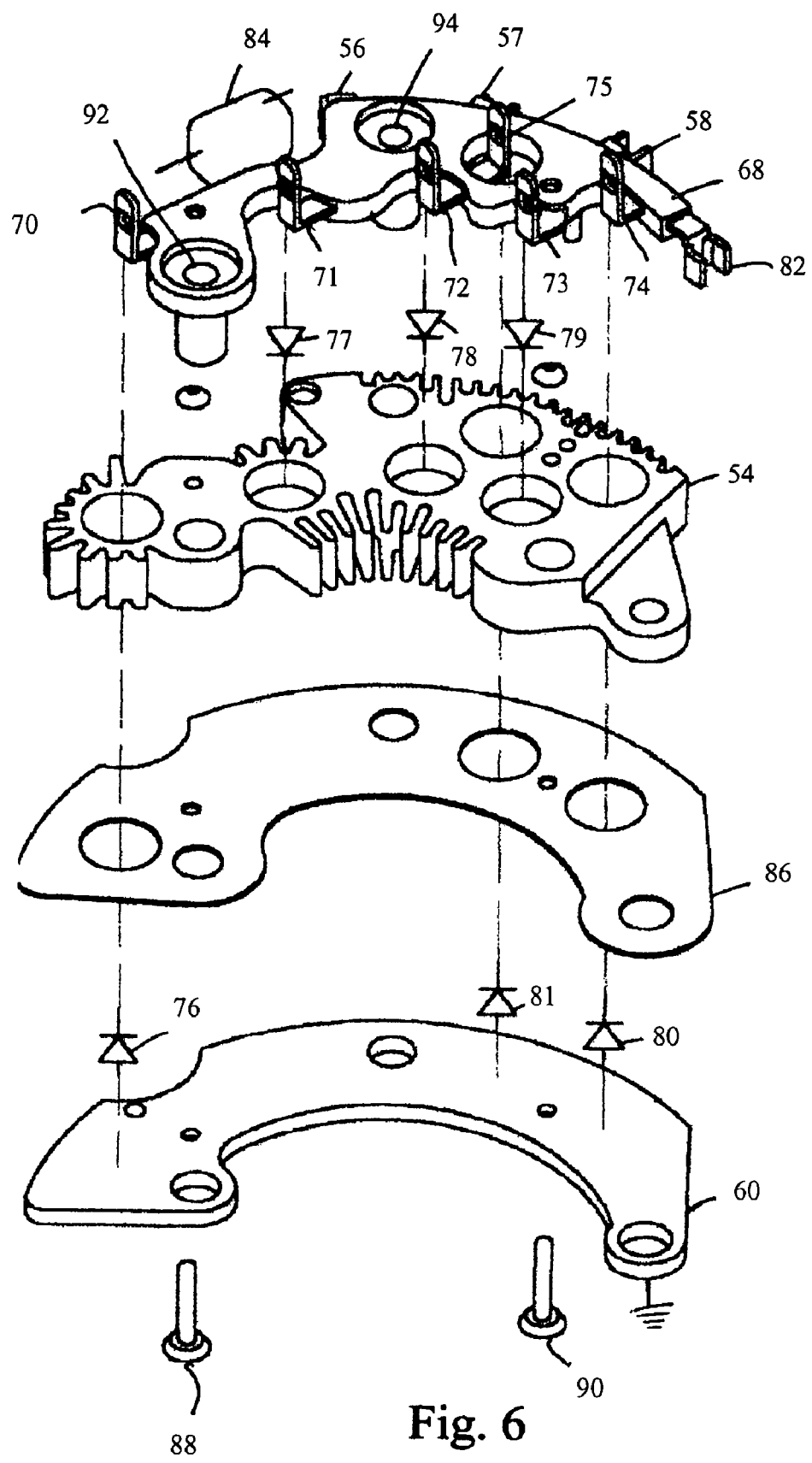
FIG. 6 is an exploded perspective view of the rectifier bridge assembly of FIG. 2.

With reference to the figures for purposes of illustration, a rectifier bridge assembly 40, illustrated in FIGS. 2–5, includes six diode compartments 42, 44, 46, 48, 50 and 52 arranged in three pair of circuits forward biased to a positive lead formed from an upper portion of the housing 54 in which each forward biased pair of diode compartments connects a stator lead 56–58 in circuit between the positive lead and a negative lead formed from the lower portion of the housing 60. The actual circuit arrangement will be discussed in greater detail below; however the present shown rectifier bridge is arranged for conversion of three-phase alternating current into direct current. Each of the diode compartments 42, 44, 46, 48, 50 and 52 is contained in wells 62 formed in the upper portion rectifier bridge housing 54 that also performs the function of a heat sink. The heat dissipating properties of the heat sink are enhanced through the use of heat fins 64 formed along the lateral wall of the upper portion 54. Although the shape and dimension of the rectifier bridge assembly is guided by a number of factors including, but not limited to, size, heat dispersing capacity and conformance to existing alternator configurations, the rectifier bridge assembly as illustrated in FIGS. 2–6 conforms to the CS Series of alternators. However, the invention should not be construed as conforming to this shape. Advantageously, the wells 62 of the upper portion are filled with an epoxy material 66 that transfers heat from diodes formed in the epoxy to the heat sink. The epoxy 66 is preferably a thermo-conductive, electrically non-conductive epoxy. An epoxy of the type suitable for this purpose is sold by Lord Corp., East Weymouth, Mass.; however, those skilled in the art will appreciate that any thermally-conductive, electrically-nonconductive epoxy suitable for encapsulating automotive engine electronic components may be used.

The configuration of the diode compartments is more fully understood by examining the configuration of the rectifier bridge housing (FIG. 6) which includes the upper portion 54 of the housing 54 which also functions as a heat sink and underlies a rectifier bridge circuit 68 for connecting the diodes to the stator of the alternator (not shown). The rectifier bridge circuit 68 includes leads 70–75 for connecting to each of the diodes 76–81, a lead 82 for connecting the positive terminal to a voltage regulator such as a diode as well as terminal leads for connecting to the three leads 56–58 out of the stator. A condenser 84 is further provided to more evenly balance the power flow through the rectifier bridge assembly. The upper portion of the housing 54 also provides a circuit connection between the positive terminal lead 82 in the rectifier bridge circuit 68 and the diodes 77–79. A lower portion 60 of the housing similarly provides a connection between diodes 76, 80 and 81 and ground and is separated from the upper portion 54 by an electrically non-conductive gasket 86. Electrically non-conductive bolts 88 and 90 that may project from the lower portion 60 of the housing to the rectifier bridge circuit 68 are secured to the rectifier bridge circuit by conventional means such as a nut, riveting or welding. Furthermore electrically non-conductive bolt holes 92 and 94 for securing the rectifier bridge assembly to, for example, an alternator body may also be provided. It should be noted that only the well holes for the diodes 76, 80 and 81 that connect to the negative lead project completely through the upper portion 54 of the housing and through the gasket 86. The diodes 77–79 that connect to the positive lead are housed in wells that terminate within the upper portion of the housing.

It should be noted that the terms 'Top' or 'Upper' and 'Bottom' or 'Lower' when used to describe the housing are relative terms used herein to further understanding of the invention in relation to the drawings. The negative side of the housing is typically connected to the frame of alternator for grounding. The relative position of the negative side to the positive side may vary depending upon the design of the alternator Slip Ring End Frame (Usually called SRE Frame) for a particular model. Thus these terms should not be interpreted to limit the orientation of the invention.

Figure 7:
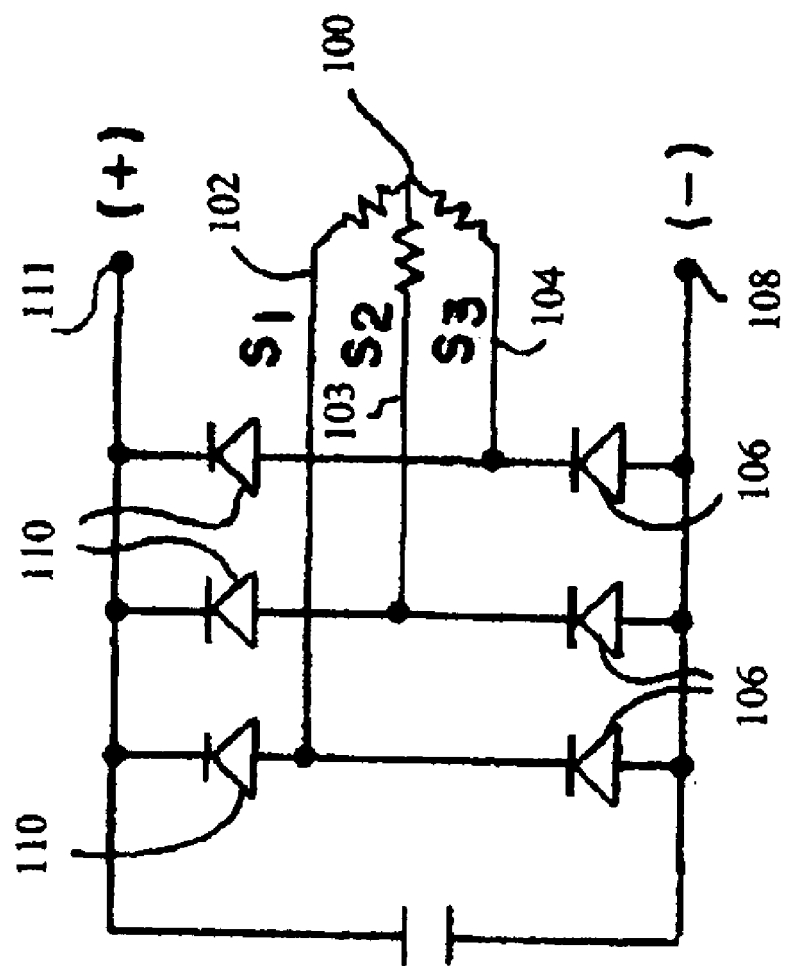
FIG. 7 is a circuit diagram of the rectifier bridge assembly.

With reference to FIG. 7, the rectifier bridge assembly provides conversion of an alternating current generated by a three-coil stator 100 that produces three phases of alternating current such as found in an alternator. Electricity generated at the stator of an automotive alternator is fed into one of three stator connection terminals 102–104. A first set of diodes 106 is disposed between a ground (−) 108 and a respective one of the three stator connection terminals 102–104, and a second set of diodes 110 is disposed between a respective one of the stator connection terminals 102–104 and a positive terminal to provide power output in the form of direct current through positive heat sink 54 to the battery (+) 11.

Figure 9:
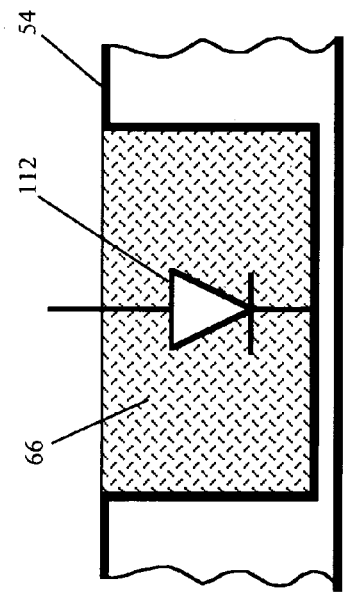
FIG. 9 is a side cut-away view of a positive biased diode connected to a positive lead taken along line B—B of FIG. 2B.
Figure 8:
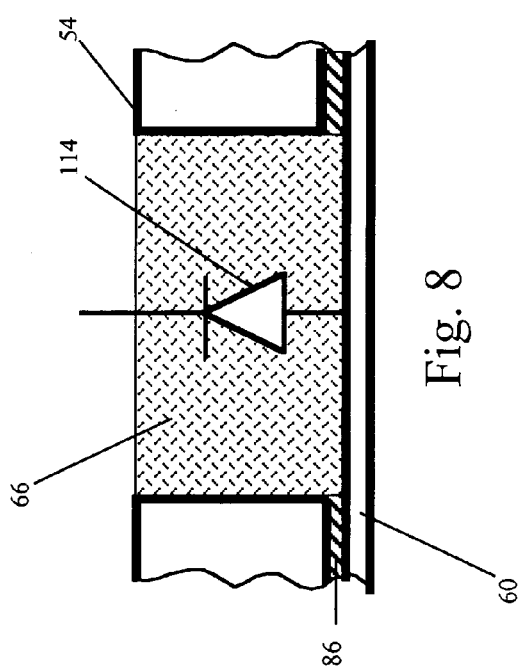
FIG. 8 is a side cut-away view of a positive biased diode connected to a negative lead taken along line A—A of FIG. 2A.

The diodes 112 (FIG. 9) that connect to the positive leads connect to the upper portion 54 of the housing while the diodes 114 (FIG. 8) that connect to the negative leads connect to the lower portion 60 of the housing. In each case (FIGS. 8 and 9), the diodes 112 and 114 are preferably attached by soldering to the housing and by any conventional means such as, but not limited to, soldering or welding to the rectifier bridge circuit. The diodes are then surrounded by the epoxy 66 that completely fills the wells. By completely filling the well with epoxy the heat from the diodes is delivered to the heat sink in the upper portion more efficiently. The epoxy further electrically isolates the diodes from contact with the positively charged upper portion of the housing, this is particularly desirable for the diodes that connect to the negative lead as they need to conduct thermal energy to the upper housing portion while remaining electrically isolated.

As described herein diodes formed from a rectifier die sandwiched between copper tabs are referred to as "cell" type diodes and are preferred as they can be soldered to the heat sink for an efficient electrical connection. Those skilled in the art will appreciate that epoxy when used to fill the well is not limited to configurations using "cell" type diodes and any conventional diodes may be used including, but not limited to, "button" type, "dish" type and "press-fit" type diodes.

Figure 10:
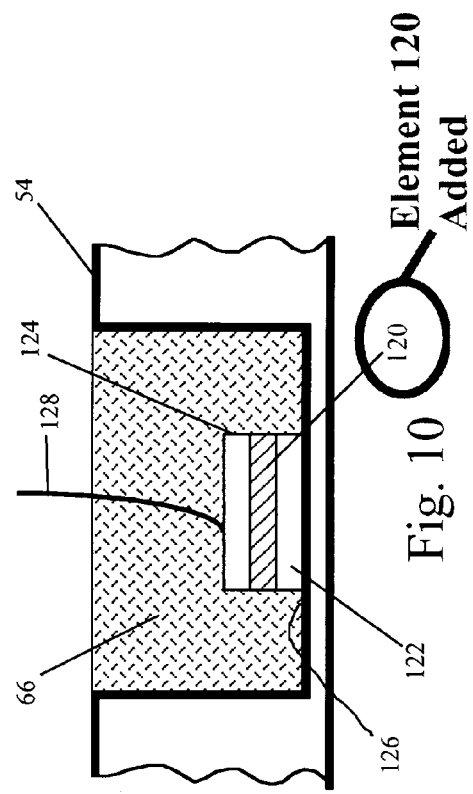
FIG. 10 is structural view of the positive based diode of FIG. 9.

With reference to FIG. 10, the installation of the diode includes providing the rectifier die 120, preferably a silicon-based semiconductor material sandwiched between two copper tabs 122 and 124 in electrical communication with the rectifier die 120. The lower copper tab 122 is directly soldered to the portion of the housing at the bottom 126 of the well which functions as a contact surface for connecting the circuit while a lead wire 128 connects between the rectifier bridge circuit 68 (FIG. 5) and the upper copper tab 124 (FIG. 10) by conventional means such as, but not limited to, soldering or welding. The space between the diode and the well walls is filled in with epoxy 66 providing a secure diode compartment. In this way the diode is attached directly to the housing and avoids the use a press-fit metal cup thereby providing a better electrical connection. Furthermore, the epoxy is not used to hold the diode with the metal cap, thereby providing an air gap to the heat sink. Instead epoxy is added to fill up the well thereby increasing the area in contact with the heat sink and providing better thermal communication to the heat sink.

Figure 11A:
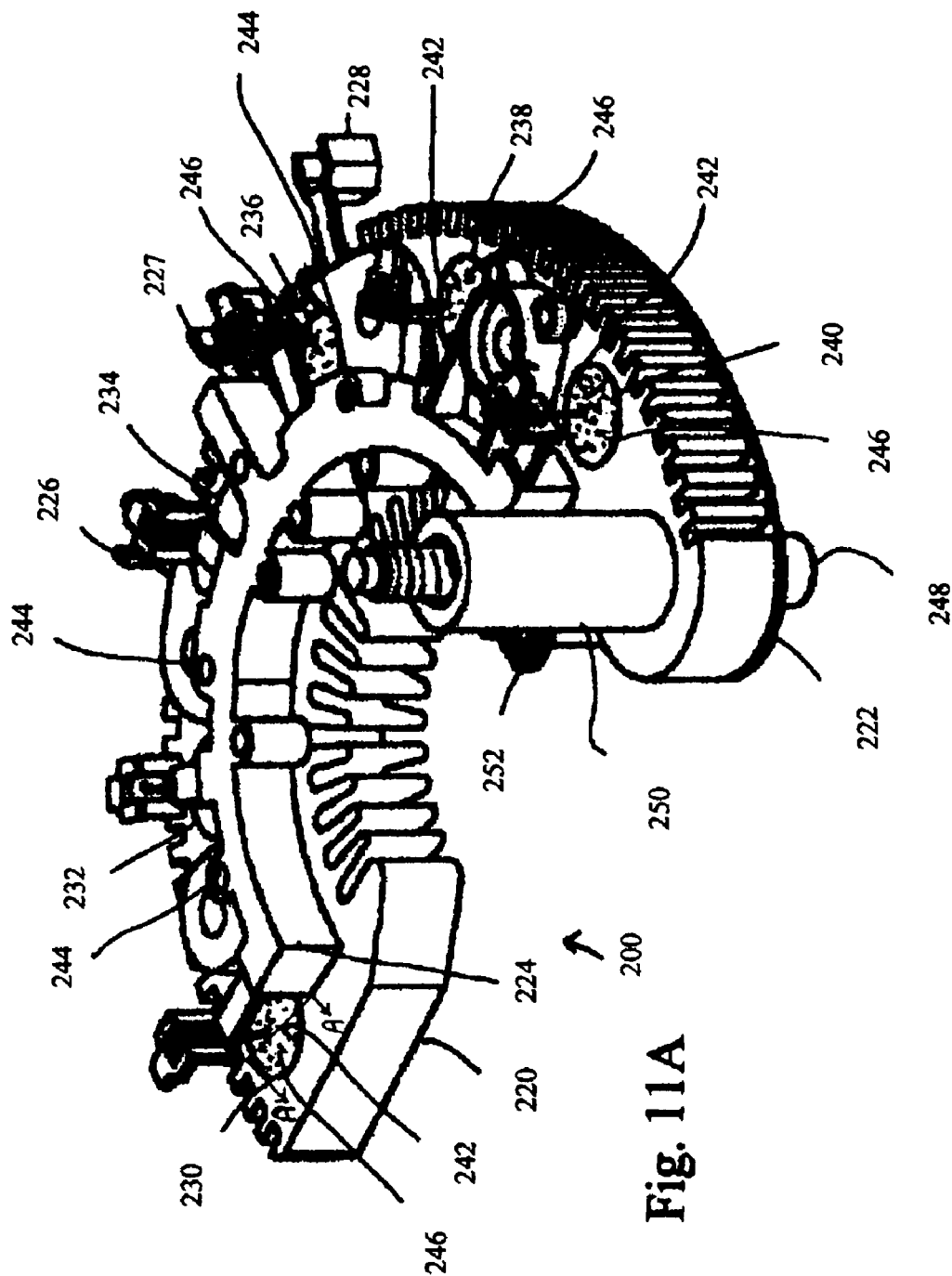
FIGS. 11A and B are perspective views of another rectifier bridge assembly according to the present invention.
Figure 11B:
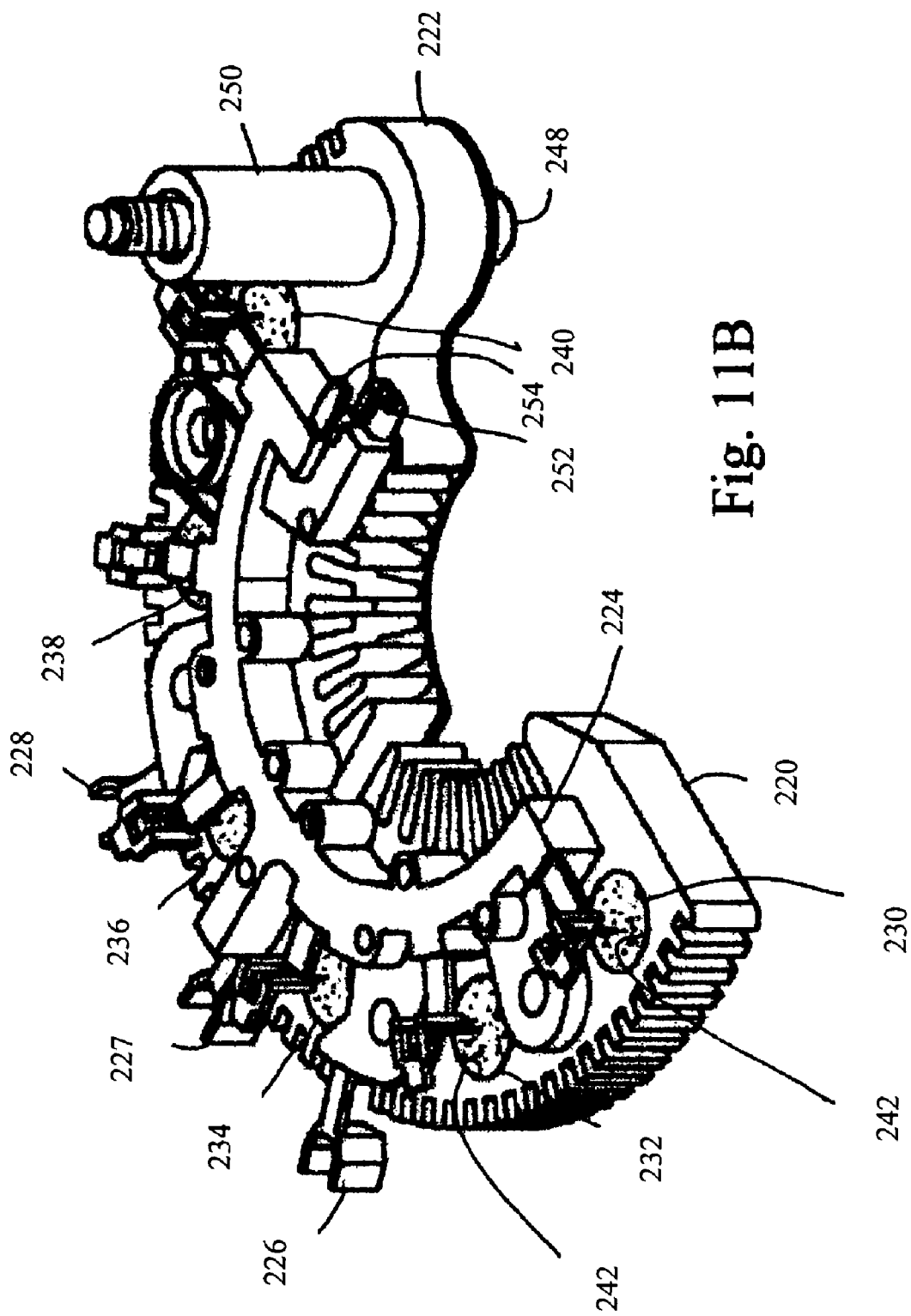
Figure 12:
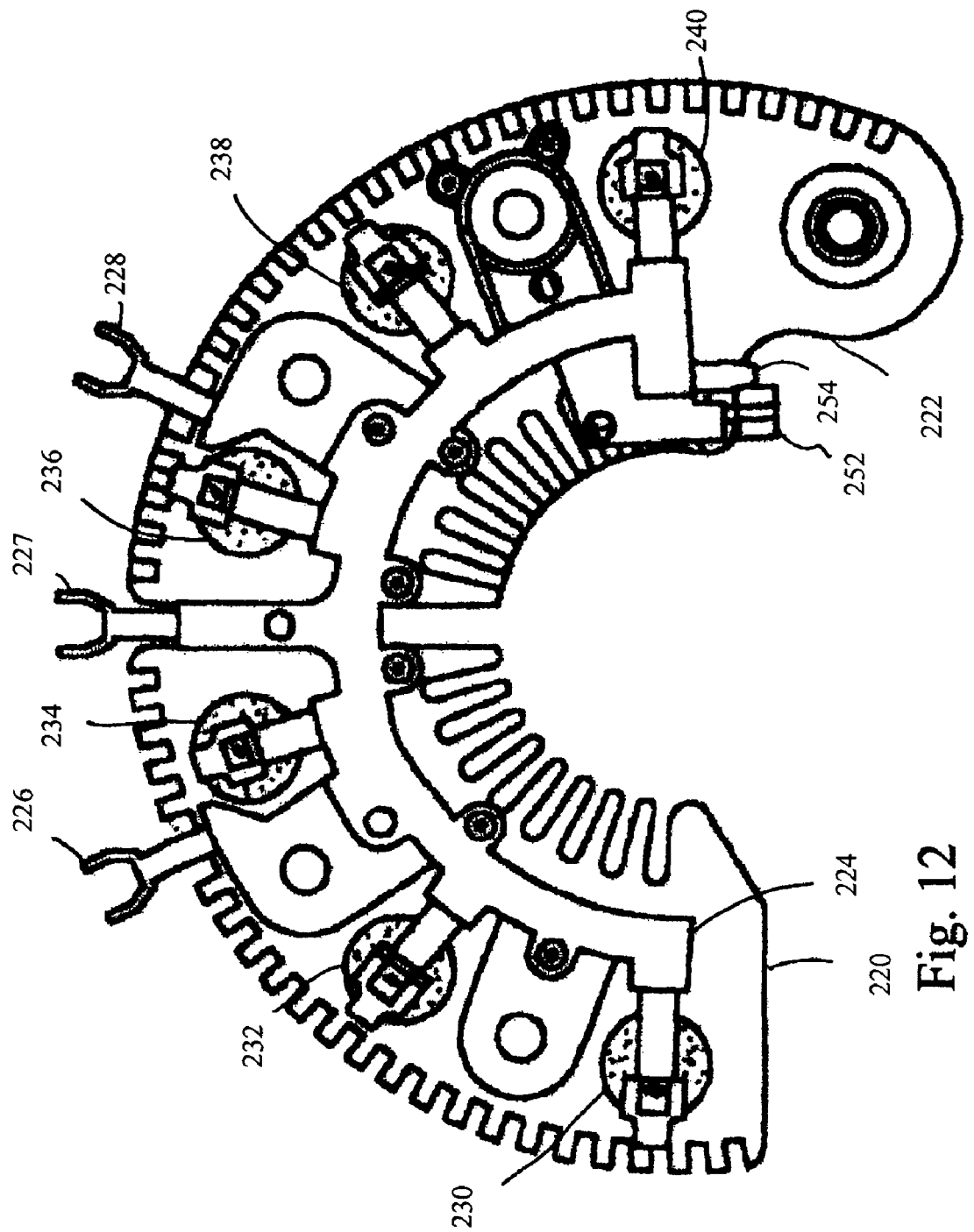
FIG. 12 is a top plan view of the rectifier bridge assembly of FIG. 11.
Figure 13:
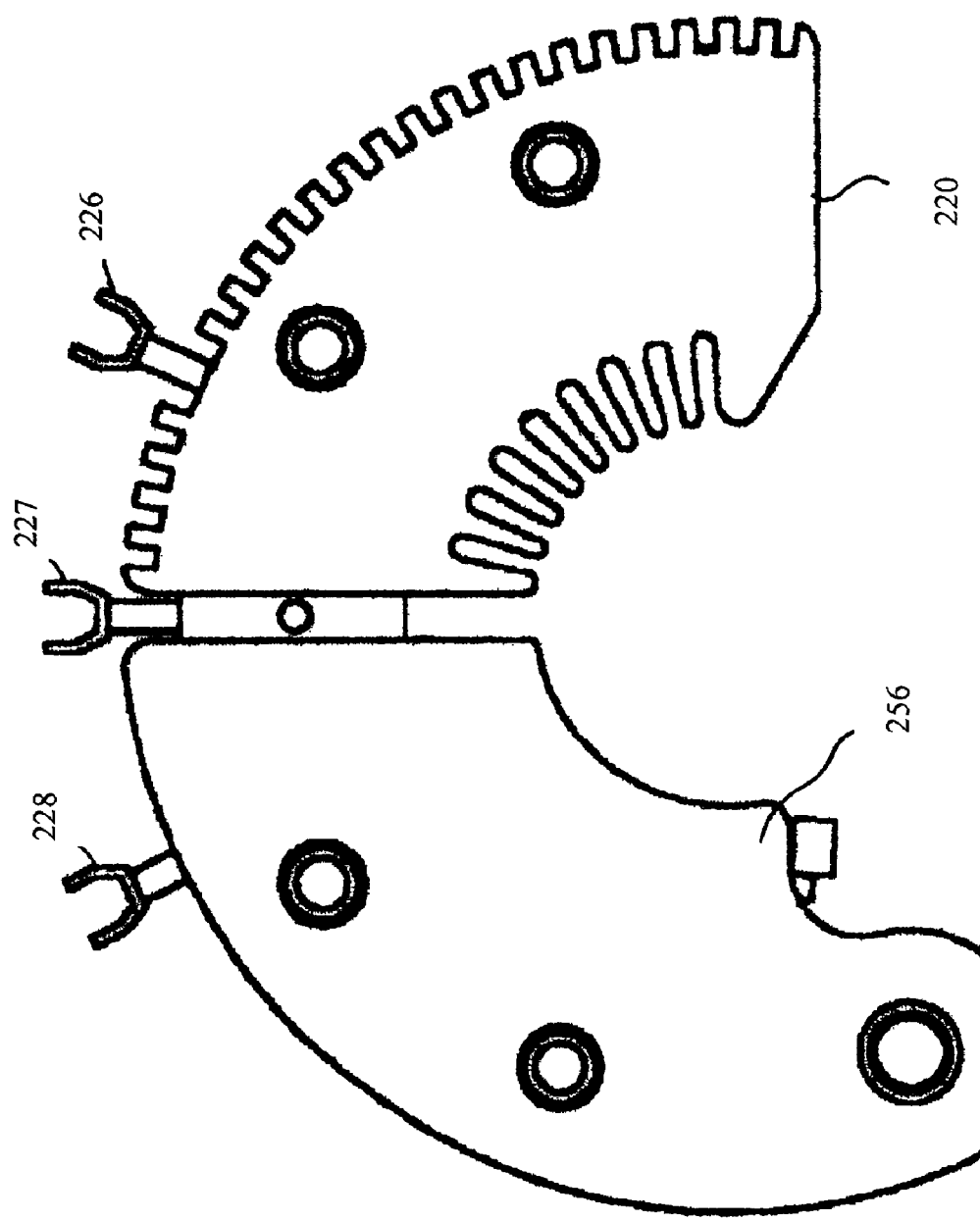
FIG. 13 is a bottom plan view of the rectifier bridge assembly of FIG. 11.
Figure 14:
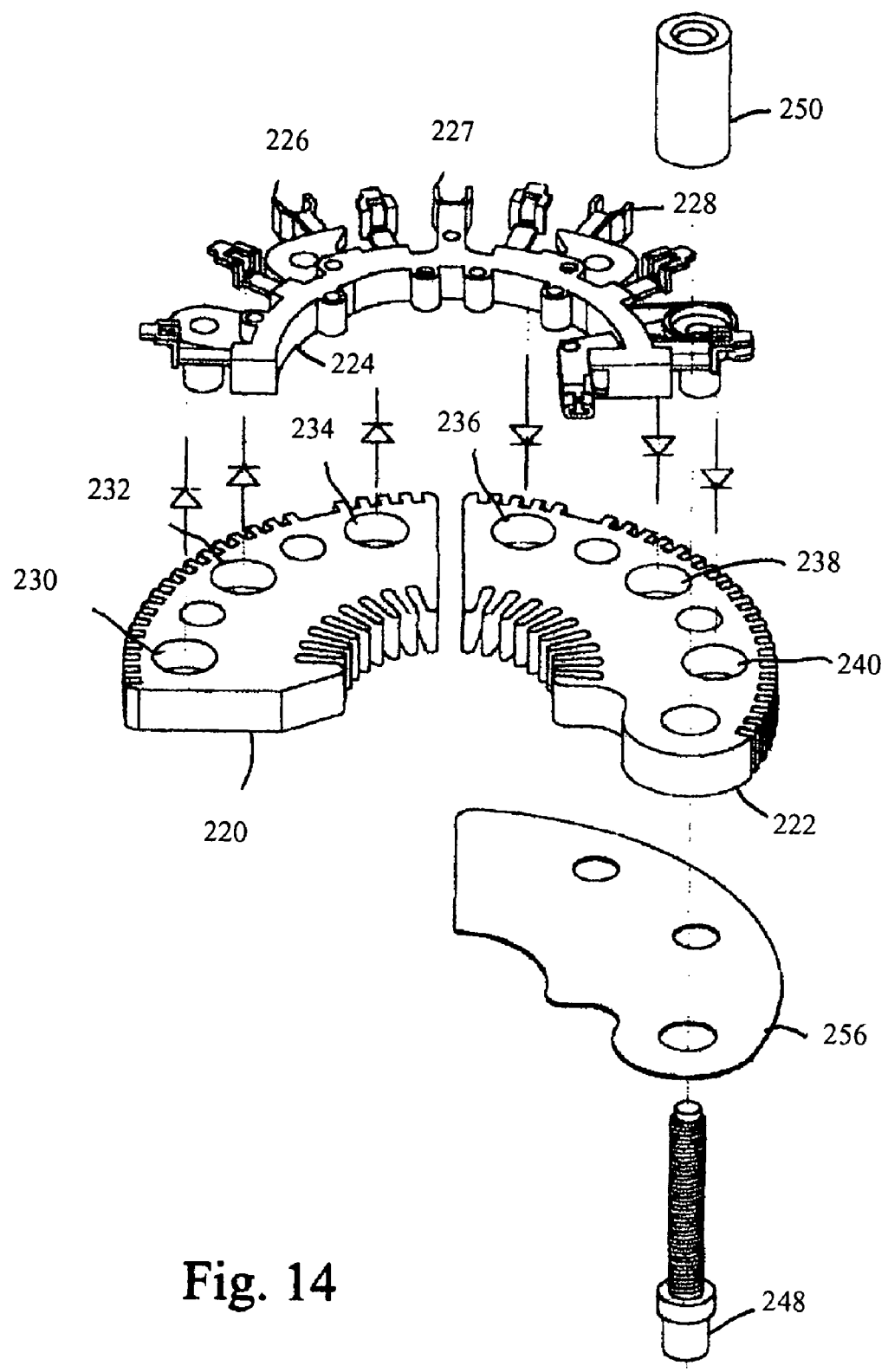
FIG. 14 is an exploded perspective view of the rectifier bridge assembly of FIG. 11.
Figure 15:
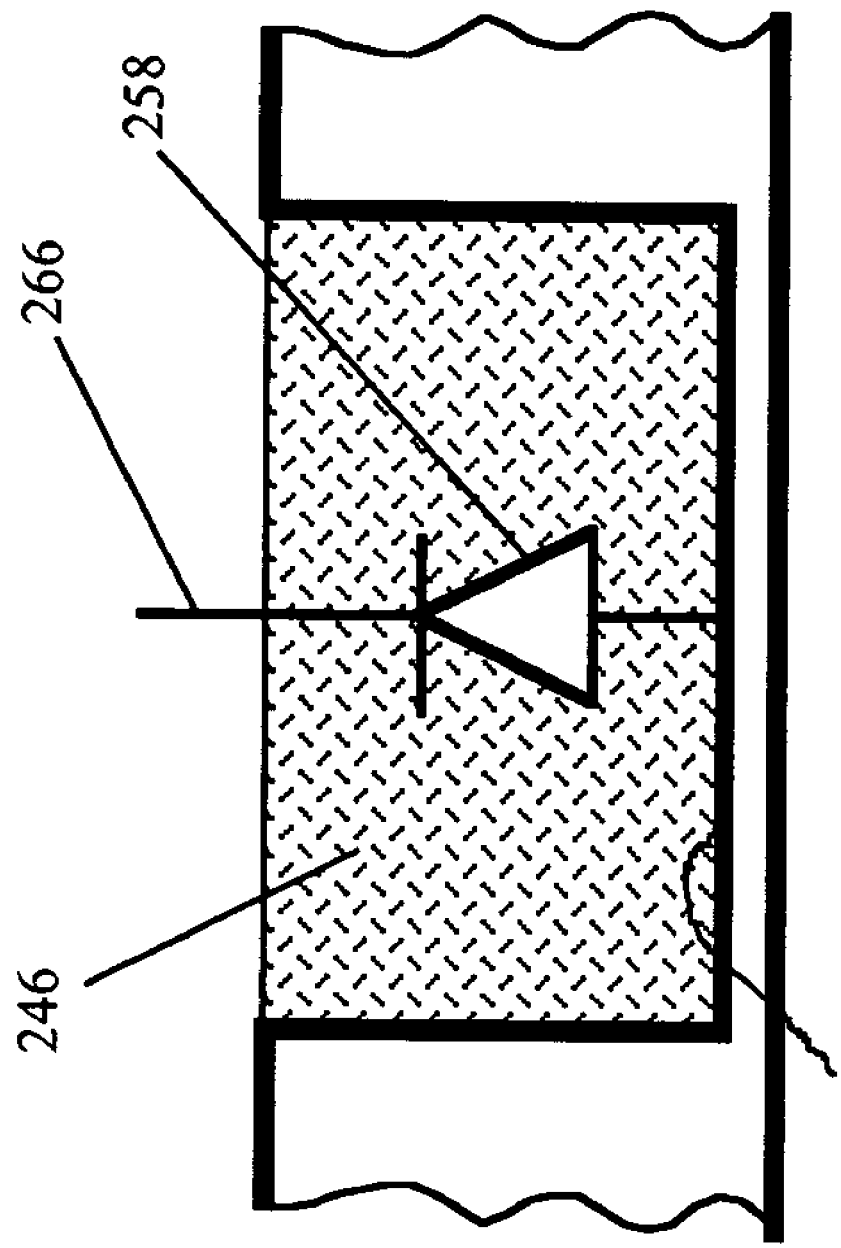
FIG. 15 is a side cut-away view of a positive biased diode connected to a negative lead taken along line A—A of FIG. 11A.

It will be appreciated by those skilled in the art that other rectifier bridge assembly configurations may be able to take advantage of the principles of this invention. With reference to FIGS. 11–13, a rectifier bridge assembly 200 utilizing the principle of positioning the diodes in parallel includes co-planar positive and negative leads 222 and 220 thereby further reducing the overall size of the rectifier bridge assembly. Such a configuration conforms to rectifier bridge assemblies of the type associated with the AD Series of alternators. The rectifier bridge assembly 200 includes a rectifier bridge circuit 224 that is configured for connecting three leads 226–228 of a three-phase stator (not shown) to the respective positive and negative leads 222 and 220 via respective diode compartments 230, 232, 234, 236, 238 and 240. The positive and negative leads 222 and 220 also function as a heat sink for the respective diodes connected thereto and sit in co-planar spaced apart relation to each other. The positive heat sink 222 and negative heat sink 220 also form the housing for diode compartments that sit in wells 242 formed into positive and negative leads 220 and 222. The diode compartments 230, 232, 234, 236, 238 and 240 are again completely filled with an electrically non-conductive, thermally conductive epoxy 246 to better establish thermal dispersion from the diodes to the heat sink. A battery connection in the form a terminal 248 and bushing 250 is provided on the positive lead to connect with a battery (not shown). Additionally, the rectifier bridge circuit includes a lead 252 for connecting to a condenser (not shown) and a lead 254 for connecting to a voltage regulator (not shown) in a conventional fashion. The positive lead 222 is further shielded by a gasket 256 or like insulating material to isolate the positively charged surface from other grounded components surrounding the lead. The diode compartment is formed as described above and illustrated by FIG. 10 in which the diode 258 (FIG. 15) formed from a rectifier sandwiched between two copper tabs is soldered to the bottom surface 264 or contact surface of the well and a lead 266 connects the diode to the rectifier bridge circuit 224 (FIG. 14). The area surrounding the well is filled in with epoxy 246.

By these descriptions, those skilled in the art will appreciate that the principals of the present invention may be practiced in any rectifier bridge configuration utilizing the positioning of diodes in parallel to conserve space within the rectifier bridge assembly while providing improve power performance with better heat dissipating properties.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A rectifier bridge assembly comprising:
    a rectifier bridge circuit adapted to connect to at least one alternating current source;
    at least two diode compartments operatively connected to said rectifier bridge circuit and a direct current output to convert alternating current into direct current; and
    a heat sink formed with at least two apertures for receiving said at least two diode compartments in spaced apart relation and in substantial contact with said heat sink;
    wherein heat from said diode compartments is evenly dispersed to said heat sink and said diode compartments include a diode surrounded by heat conductive epoxy contacting substantially all surfaces of said heat sink within said apertures.

2. The assembly of claim 1 wherein said epoxy is electrically non-conductive.

3. The assembly of claim 1 wherein said diode compartments include a diode formed from a rectifier die electrically connected to first and second copper tabs wherein said first copper tab is electrically connected to a contact surface in said aperture and said second copper tab is electrically connected to said rectifier bridge circuit.

4. The assembly of claim 3 wherein said diode compartments include said diode surrounded by heat conductive epoxy contacting substantially all surfaces of said heat sink within said apertures.

5. The assembly of claim 4 wherein said epoxy is electrically non-conductive.

6. The assembly of claim 5 wherein said contact surface of at least one of said apertures is connected to a negative lead of a direct current circuit.

7. The assembly of claim 5 wherein said contact surface of at least one of said apertures is connected to a positive lead of a direct current circuit.

8. The assembly of claim 6 wherein said contact surface of at least one of said apertures is connected to a positive lead of a direct current circuit.

9. The assembly of claim 5 wherein said electrical connection of said first copper tab to said contact surface is by soldering.

10. The assembly of claim 5 wherein said electrical connection of said second copper tab to said rectifier bridge is by soldering or welding.

11. The assembly of claim 5 wherein said heat sink includes fins.

12. A rectifier bridge assembly for use with an automotive alternator, comprising:
- a base plate mounted to the alternator and providing a negative lead;
- an overlying finned positive lead operative as a heat sink;
- means for connecting said base plate to said overlying positive lead in an electrically non-conductive relation;
- a plurality of wells formed into said positive lead in which a first portion of said wells have a bottom formed in said positive lead and a second portion of said wells have a bottom formed in said negative lead;
- a plurality of diodes mounted in said wells and electrically connected to a contact surface of said wells;
- a thermally conductive and electrically non-conductive epoxy surrounding said diodes and in thermal communication with all surfaces within said well;
- a plurality of stator connection terminals which each receives alternating current (AC) from the alternator and connects to a circuit overlying the positive lead;
- said circuit being organized such that each of said stator connection terminals connects in circuit to said base plate across one of said plurality of diodes and to said positive lead across one of said plurality of diodes.

13. The assembly of claim 12 wherein the plurality of diodes connect to said bottom surface of said wells by soldering.

14. The assembly of claim 12 wherein the plurality of diodes connect to said circuit by soldering or welding.

15. A rectifier bridge assembly for use with an automotive alternator, comprising:
- a first finned base plate mounted to said alternator and providing a negative lead;
- a second finned base plate mounted to the alternator in spaced apart relation to said first base plate and providing a positive lead;
- means for connecting said second base plate to said alternator in an electrically non-conductive relation;
- a plurality of wells formed into said first and second base plates;
- a plurality of diodes mounted in said wells and electrically connected to a contact surface of said wells;
- a thermally conductive and electrically non-conductive epoxy surrounding the diodes and in thermal communication with all surfaces within the well;
- a plurality of stator connection terminals which each receives alternating current (AC) from the alternator and connects to a circuit overlying the first and second base plates;
- said circuit being organized such that each of said stator connection terminals connects in circuit to said first base plate across one of said plurality of diodes and to said second base plate across one of said plurality of diode.

16. The assembly of claim 15 wherein said diodes connect to said bottom surface of said wells by soldering.

17. The assembly of claim 15 wherein said diodes connect to said circuit by welding or soldering.

18. The assembly of claim 15 having a heat sink formed from at least one of said first and second base plates.

19. A diode compartment for use in a rectifier bridge assembly having individual apertures for receiving said diode compartment in a beat sink comprising the steps of:
- providing a diode having a rectifier die electrically connected between a first and second copper tab;
- physically connecting said first copper tab directly to a surface of said heat sink within said aperture;
- providing an electrical connection from said second copper tab to a rectifier bridge circuit; and
- surrounding said diode with thermally conductive, electrically non-conductive epoxy.

20. The diode compartment of claim 19 wherein said physically connecting step includes soldering the first copper tab to said surface.

21. The diode compartment of claim 19 wherein said surrounding step includes filling in said entire aperture with epoxy such that substantially all surfaces within the aperture are in contact with said epoxy.

* * * * *